(12) United States Patent
Kato et al.

(10) Patent No.: US 9,444,126 B2
(45) Date of Patent: Sep. 13, 2016

(54) HIGH-FREQUENCY SIGNAL LINE

(71) Applicant: Murata Manufacturing Co., Ltd., Nagaokakyo-shi, Kyoto-fu (JP)

(72) Inventors: Noboru Kato, Nagaokakyo (JP); Satoshi Ishino, Nagaokakyo (JP); Jun Sasaki, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 37 days.

(21) Appl. No.: 14/509,290

(22) Filed: Oct. 8, 2014

(65) Prior Publication Data

US 2015/0022286 A1 Jan. 22, 2015

Related U.S. Application Data

(63) Continuation of application No. PCT/JP2013/066210, filed on Jun. 12, 2013.

(30) Foreign Application Priority Data

Jun. 29, 2012 (JP) ................................ 2012-147303

(51) Int. Cl.
*H01P 1/203* (2006.01)
*H01P 1/201* (2006.01)
(Continued)

(52) U.S. Cl.
CPC .......... *H01P 1/2039* (2013.01); *H01P 1/2013* (2013.01); *H01P 3/003* (2013.01); *H01P 3/08* (2013.01); *H05K 1/024* (2013.01); *H05K 1/028* (2013.01); *H05K 1/0219* (2013.01);
(Continued)

(58) Field of Classification Search
CPC ...... H01P 1/2013; H01P 3/003; H01P 3/006; H01P 3/08; H01P 3/082; H05K 1/024
USPC ......................................................... 333/238
See application file for complete search history.

(56) References Cited

U.S. PATENT DOCUMENTS 5,753,968 A * 5/1998 Bahl ....................... H01L 23/66
257/631
6,674,347 B1 * 1/2004 Maruhashi ............. H01P 3/003
333/161

(Continued)

FOREIGN PATENT DOCUMENTS

JP 2004-120260 A 4/2004
JP 2008-252257 A 10/2008

(Continued)

OTHER PUBLICATIONS

Official Communication issued in corresponding Japanese Patent Application No. 2014-522526, mailed on Jan. 13, 2015.

(Continued)

*Primary Examiner* — Stephen E Jones
*Assistant Examiner* — Scott S Outten
(74) *Attorney, Agent, or Firm* — Keating & Bennett, LLP

(57) ABSTRACT

A high-frequency signal line includes a base layer including first and second principal surfaces, a signal line provided on the first principal surface, a ground conductor provided on the first principal surface along the signal line, and a plurality of high-permittivity portions arranged along the signal line and in contact with a portion of both the signal line and the ground conductor, each of the high-permittivity portions having a higher specific permittivity than the base layer.

20 Claims, 11 Drawing Sheets

(51) Int. Cl.
*H01P 3/00* (2006.01)
*H01P 3/08* (2006.01)
*H05K 1/02* (2006.01)

(52) U.S. Cl.
CPC ............... *H05K2201/0187* (2013.01); *H05K 2201/09727* (2013.01)

(56) References Cited

U.S. PATENT DOCUMENTS

| | | | | |
|---|---|---|---|---|
| 7,145,411 | B1* | 12/2006 | Blair | H01P 3/006 333/247 |
| 7,940,144 | B2* | 5/2011 | Koch | H01P 3/08 333/238 |
| 2004/0155728 | A1* | 8/2004 | Cheung | H01P 3/003 333/161 |
| 2008/0100394 | A1* | 5/2008 | Margomenos | H01P 1/047 333/32 |
| 2010/0225425 | A1 | 9/2010 | Cho | |
| 2010/0237967 | A1 | 9/2010 | Ueno et al. | |
| 2012/0274423 | A1 | 11/2012 | Kato | |

FOREIGN PATENT DOCUMENTS

| | | |
|---|---|---|
| JP | 2010-213281 A | 9/2010 |
| JP | 3173143 U | 1/2012 |
| WO | 2009/047876 A1 | 4/2009 |
| WO | 2012/073591 A1 | 6/2012 |
| WO | 2013/027409 A1 | 2/2013 |

OTHER PUBLICATIONS

Official Communication issued in corresponding Japanese Patent Application No. 2014-522526, mailed on Apr. 14, 2015.
Mine, H. et al., "A Study on Control of Band Characteristics for Wide-BPFs of MSL Loaded with Stubs and Dielectric Rods Periodically (Sub Millimeter Wave Technology/Microwave Power Application/General)", The Institute of Electronics, Information and Communication Engineers Technical Report, vol. 106, No. 323, Oct. 19, 2006, pp. 123-128, MW2006-128).
Official Communication issued in International Patent Application No. PCT/JP2013/066210, mailed on Sep. 3, 2013.
Collin, "Foundation for Microwave Engineering," 2nd Edition, McGraw-Hill, Inc., Aug. 16, 1999. pp. 175-178.

* cited by examiner

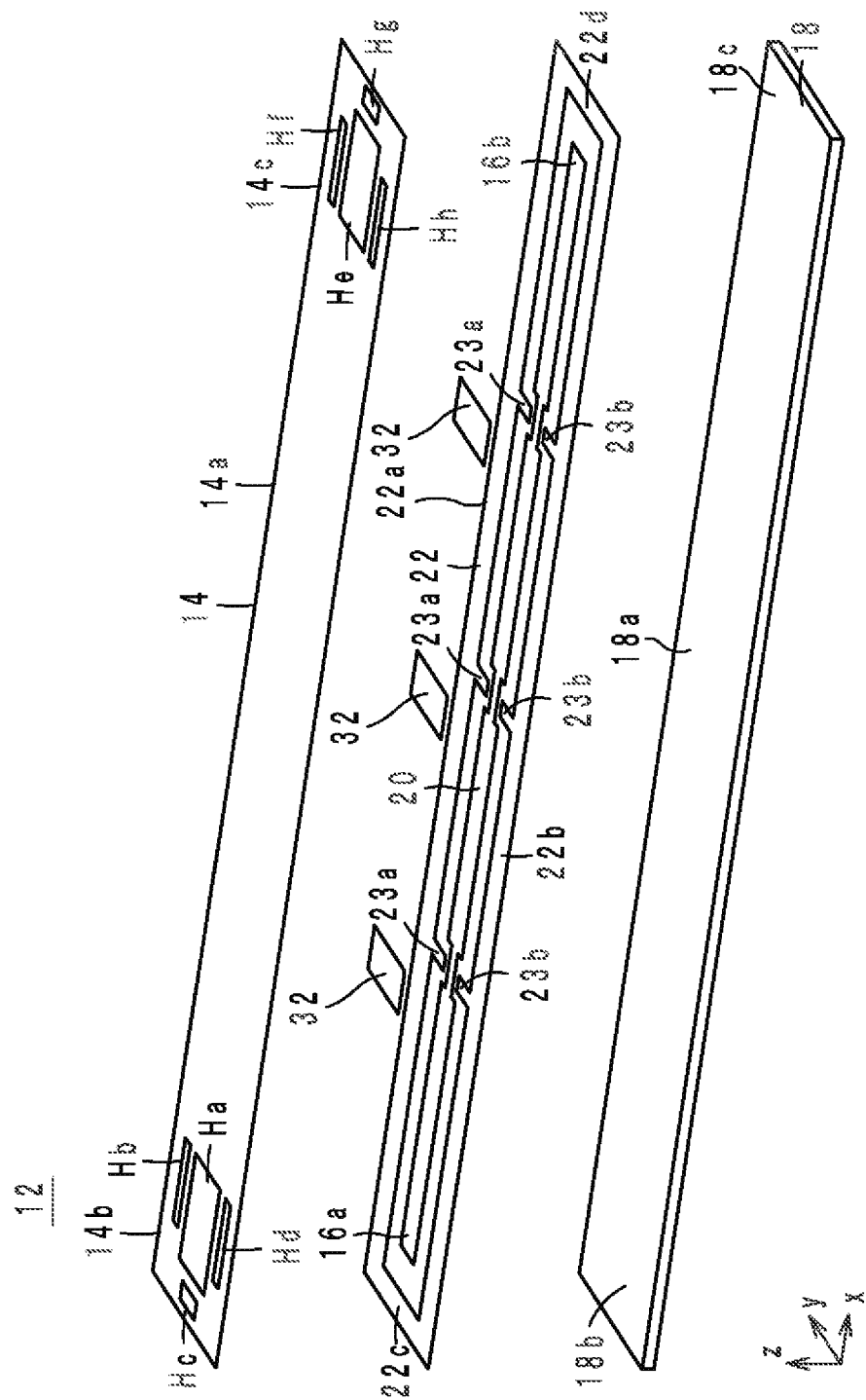

HIGH-FREQUENCY SIGNAL LINE

This application is based on Japanese Patent Application No. 2012-147303 filed on Jun. 29, 2012, and International Application No. PCT/JP2013/066210 filed on Jun. 12, 2013, the entire contents of each of which is incorporated herein by reference.

BACKGROUND OF THE INVENTION

1. Field of the Invention

The present invention relates to high-frequency signal lines, more particularly to a high-frequency signal line preferably for use in high-frequency signal transmission.

2. Description of the Related Art

As a conventional high-frequency signal line, a signal line described in, for example, Japanese Utility Model No. 3173143 is known. FIG. 11 is an exploded view of the high-frequency signal line 500 described in Japanese Utility Model No. 3173143.

The high-frequency signal line 500 includes a dielectric element assembly 502, a signal line 506, and ground conductors 508 and 510. The dielectric element assembly 502 is formed by laminating dielectric sheets 504a to 504c. The signal line 506 is provided on the top surface of the dielectric sheet 504b. The ground conductors 508 and 510 are provided respectively on the top surfaces of the sheets 504a and 504c.

Furthermore, the ground conductor 508 has a plurality of openings 520 provided along the signal line 506. Accordingly, the signal line 506 overlaps alternatingly with the openings 520 and bridge portions 522. In the high-frequency signal line 500 thus configured, the characteristic impedance of the signal line 506 is lower in the areas where the signal line 506 overlaps with the openings 520 than in the areas where the signal line 506 overlaps with the bridge portions 522. Accordingly, the characteristic impedance of the signal line 506 fluctuates cyclically. As a result, in the high-frequency signal line 500, a high-frequency standing wave with a half wavelength that is approximately equal to the interval between the bridge portions 522 occurs, but there is little chance of generating a low-frequency standing wave with a half wavelength equal to about the entire length of the high-frequency signal line 500. Therefore, in the high-frequency signal line 500, the occurrence of low-frequency noise is suppressed.

Incidentally, the high-frequency signal line 500 requires the three dielectric sheets 504a to 504c. Accordingly, the high-frequency signal line 500 is demanded to be further reduced in thickness as a whole.

SUMMARY OF THE INVENTION

A high-frequency signal line according to a preferred embodiment of the present invention includes a base layer including first and second principal surfaces, a signal line provided on the first principal surface, a ground conductor provided on the first principal surface along the signal line, and a plurality of high-permittivity portions arranged along the signal line and in contact with a portion of both the signal line and the ground conductor, each of the high-permittivity portions having a higher specific permittivity than the base layer.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 6 is an oblique exploded view of a laminate of a high-frequency signal line according to a first modification of a preferred embodiment of the present invention.

DETAILED DESCRIPTION OF THE PREFERRED EMBODIMENTS

Hereinafter, a high-frequency signal line according to preferred embodiments of the present invention will be described with reference to the drawings.

Figure 1:
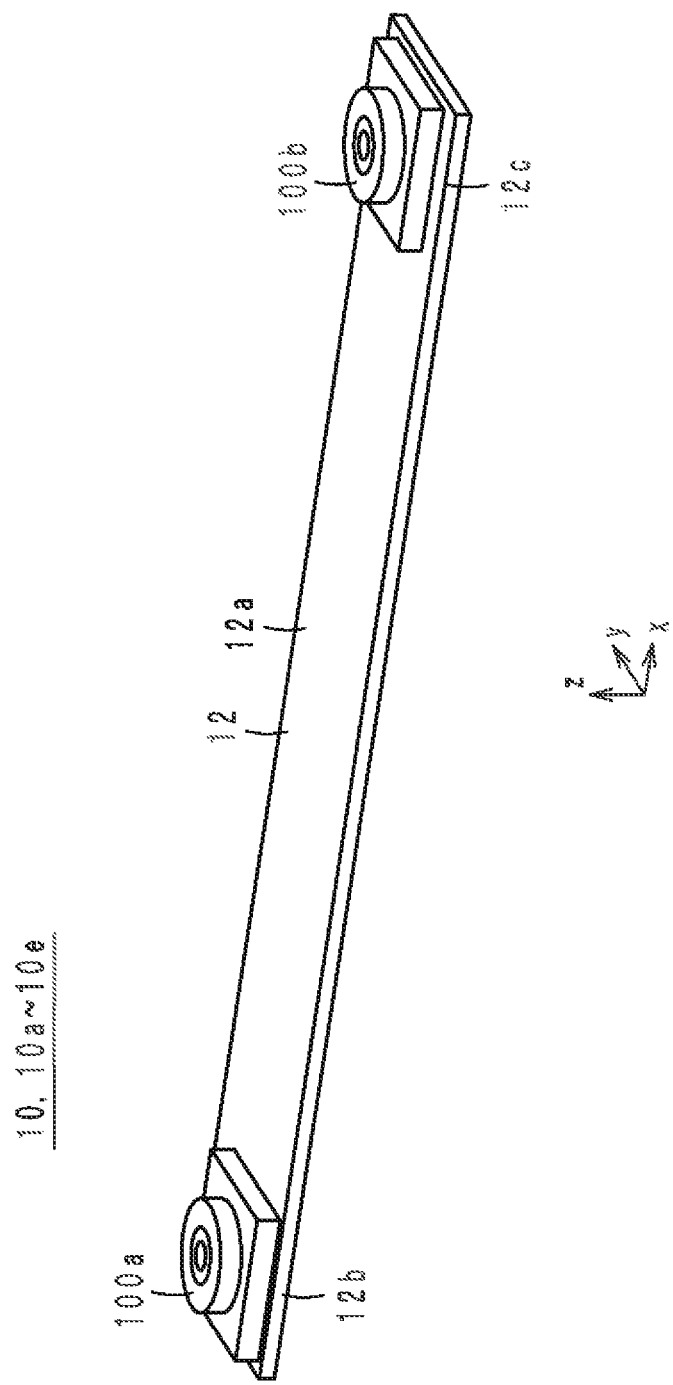
FIG. 1 is an external oblique view of a high-frequency signal line according to a preferred embodiment of the present invention.
Figure 2:
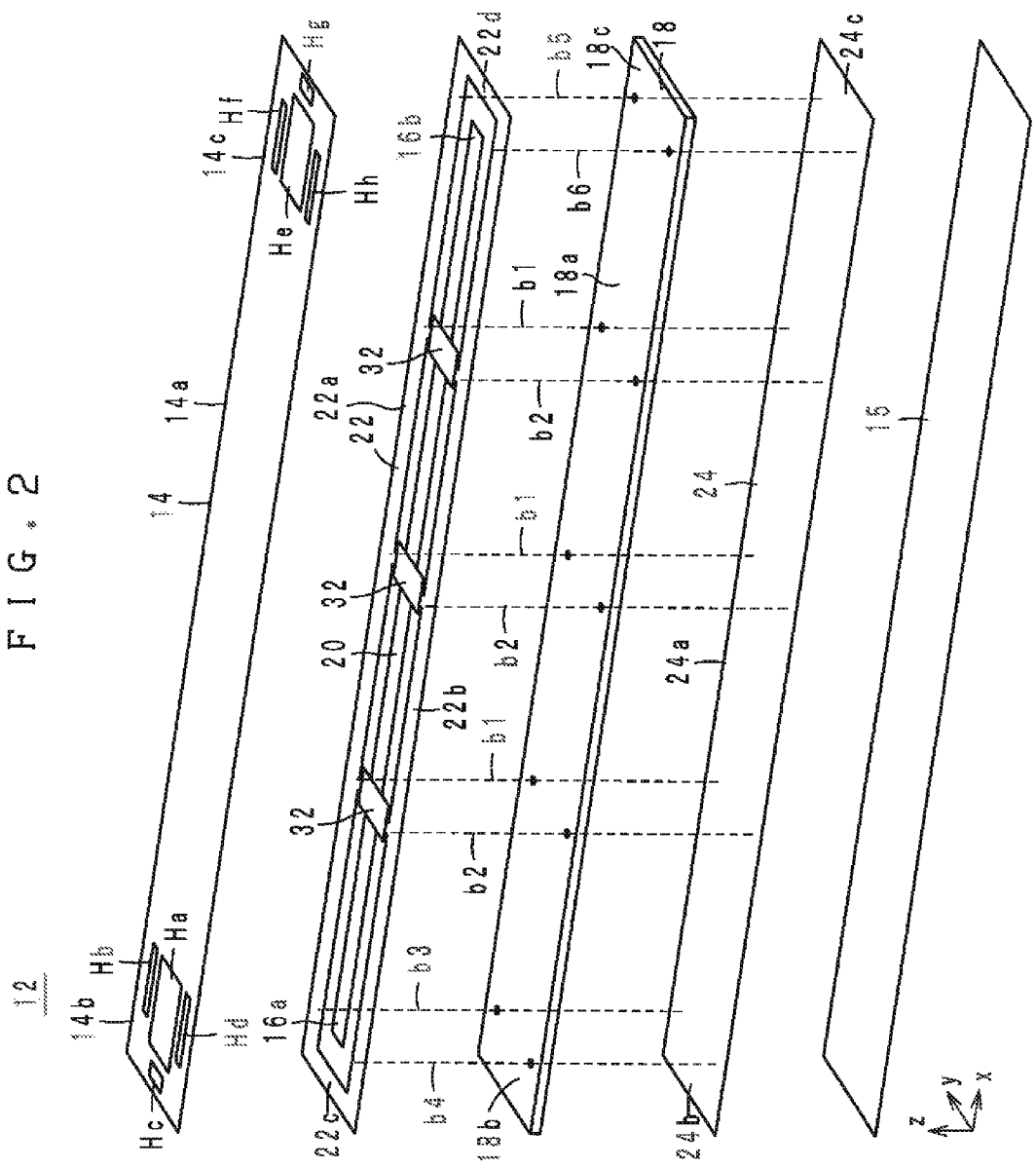
FIG. 2 is an oblique exploded view of a laminate of the high-frequency signal line according to a preferred embodiment of the present invention.
Figure 3:
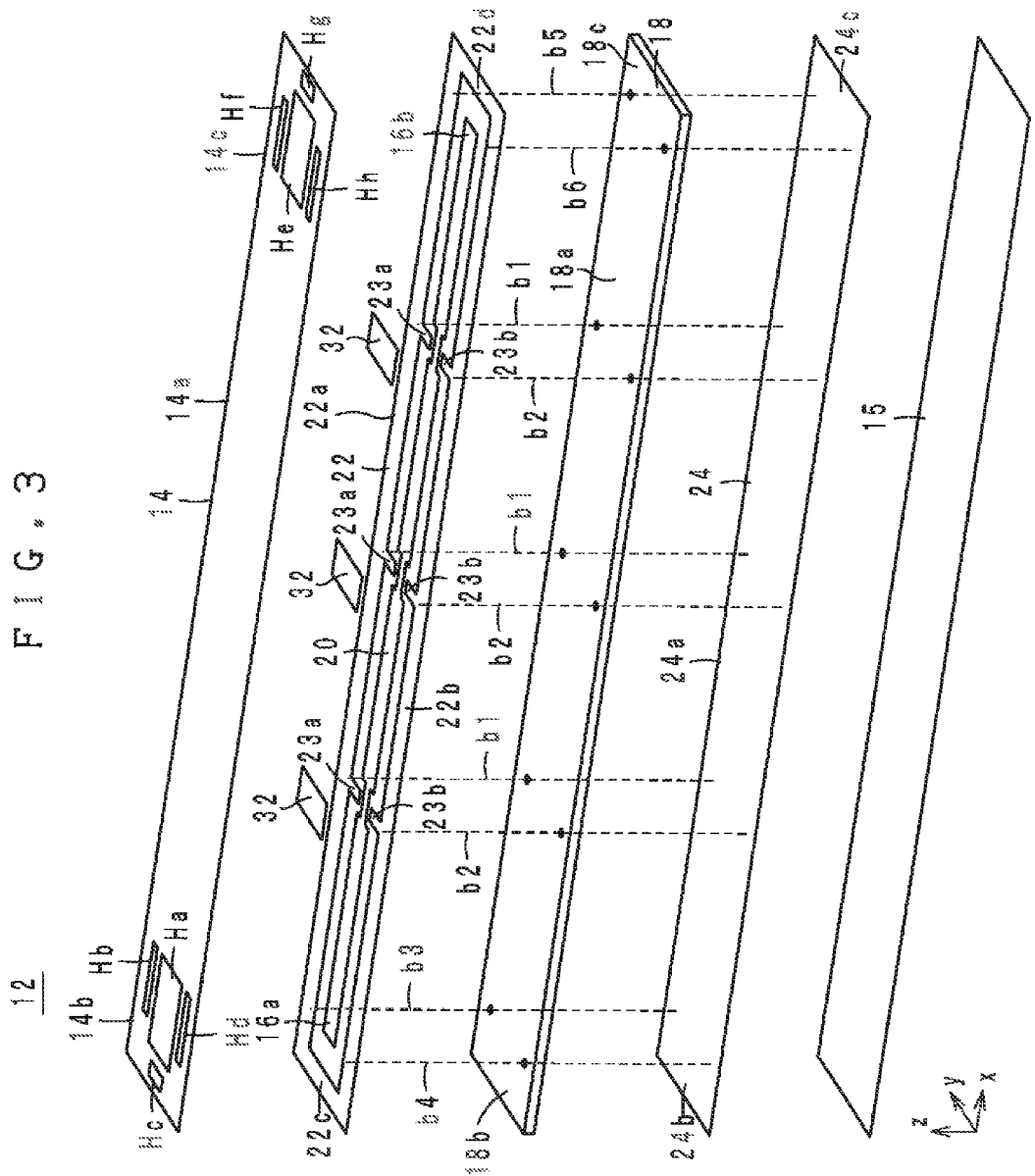
FIG. 3 is an oblique exploded view of the laminate of the high-frequency signal line according to a preferred embodiment of the present invention.
Figure 4:
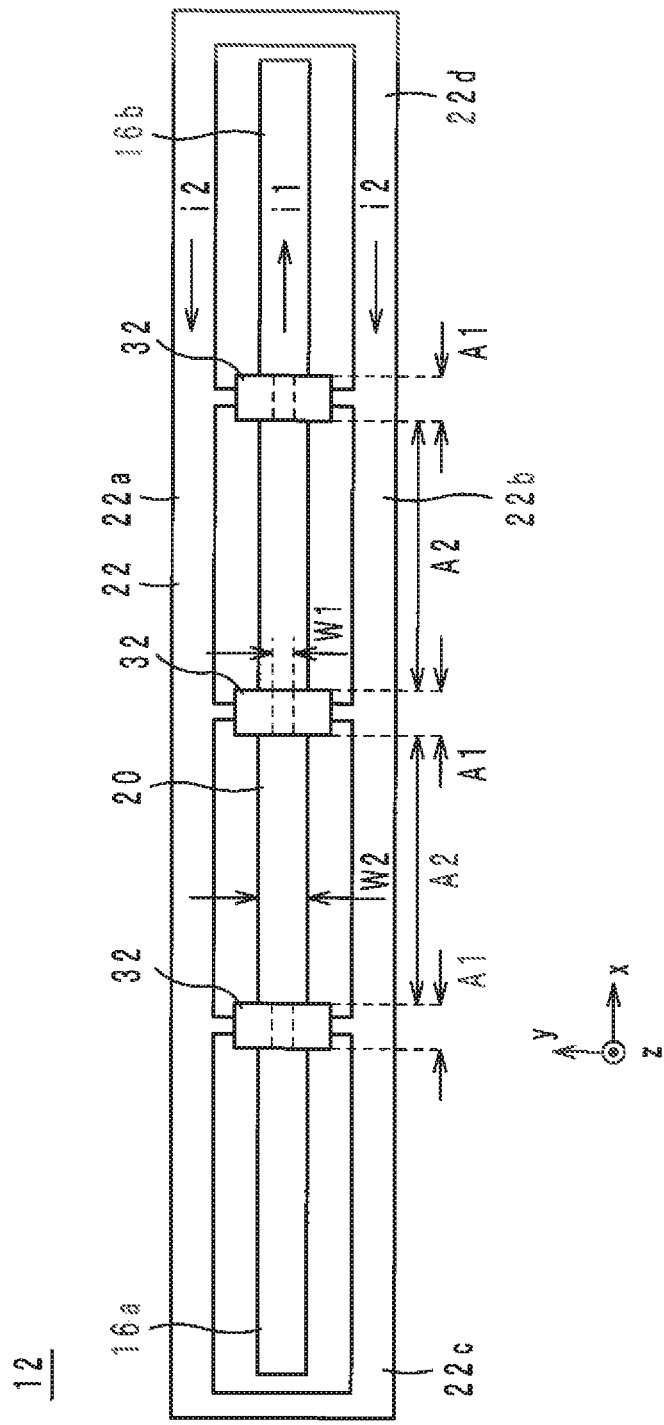
FIG. 4 is a top view of the high-frequency signal line according to a preferred embodiment of the present invention.

The configuration of the high-frequency signal line according to preferred embodiments will be described below with reference to the drawings. FIG. 1 is an external oblique view of the high-frequency signal line 10 according to a preferred embodiment of the present invention. FIGS. 2 and 3 are oblique exploded views of a laminate 12 of the high-frequency signal line 10 according to the present preferred embodiment of the present invention. FIG. 4 is a top view of the high-frequency signal line 10 according to the present preferred embodiment of the present invention. In FIGS. 1 through 4, the direction of lamination of the high-frequency signal line 10 will be defined as a z-axis direction. In addition, the longitudinal direction of the high-frequency signal line 10 will be defined as an x-axis direction, and the direction perpendicular to the x-axis and z-axis directions will be defined as a y-axis direction.

The high-frequency signal line 10 includes a main body 12, a signal line 20, ground conductors 22 and 24, high-permittivity portions 32, connectors 100a and 100b, and via-hole conductors b1 to b6, as shown in FIGS. 1 through 3.

The main body 12 extends in the x-axis direction when viewed in a plan view in the z-axis direction, and includes a line portion 12a and connecting portions 12b and 12c. The main body 12 is a flexible laminate body including a protective layer 14, a dielectric sheet 18, and a protective layer 15 laminated in this order from the positive side to the negative side in the z-axis direction, as shown in FIG. 2. In the following, the principal surface of the main body 12 that is located on the positive side in the z-axis direction will be referred to as a top surface, and the principal surface of the main body 12 that is located on the negative side in the z-axis direction will be referred to as a bottom surface.

The line portion 12a extends in the x-axis direction, as shown in FIG. 1. The connecting portion 12b preferably has a rectangular or substantially rectangular shape connected to the end of the line portion 12a on the negative side in the x-axis direction. The connecting portion 12c preferably has a rectangular or substantially rectangular shape connected to the end of the line portion 12a on the positive side in the x-axis direction. The width of each of the connecting portions 12b and 12c in the y-axis direction preferably is equal or substantially equal to the width of the line portion 12a in the y-axis direction. Accordingly, the main body 12, when viewed in a plan view in the z-axis direction, preferably has an elongated rectangular or elongated substantially rectangular shape extending in the x-axis direction.

The dielectric sheet 18, when viewed in a plan view in the z-axis direction, extends in the x-axis direction and has the same shape as the main body 12. The dielectric sheet 18 preferably is made of a flexible thermoplastic resin such as polyimide or liquid crystal polymer. The dielectric sheet 18 preferably has a specific permittivity of, for example, 4. The thickness of the dielectric sheet 18 after the lamination preferably is, for example, about 200 μm. Moreover, the width of the dielectric sheet 18 in the y-axis direction preferably is, for example, about 800 μm. In the following, the principal surface of the dielectric sheet 18 that is located on the positive side in the z-axis direction will be referred to as a top surface, and the principal surface of the dielectric sheet 18 that is located on the negative side in the z-axis direction will be referred to as a bottom surface.

Furthermore, the dielectric sheet 18 includes a line portion 18a and connecting portions 18b and 18c. The line portion 18a is included in the line portion 12a. The connecting portion 18b is included in the connecting portion 12b. The connecting portion 18c is included in the connecting portion 12c.

The signal line 20 is a linear conductor provided on the top surface of the dielectric sheet 18 and extending in the x-axis direction, as shown in FIG. 2. The end of the signal line 20 that is located on the negative side in the x-axis direction is positioned at the center or approximate center on the top surface of the connecting portion 18b. Similarly, the end of the signal line 20 that is located on the positive side in the x-axis direction is positioned at the center or approximate center on the top surface of the connecting portion 18c. The signal line 20 preferably is made of a metal material mainly composed of silver or copper and having a low specific resistance. Both ends of the signal line 20 on the negative and positive sides in the x-axis direction are used as external terminals. The ends of the signal line 20 on the negative and positive sides in the x-axis direction will be referred to below as external terminals 16a and 16b, respectively. The surfaces of the external terminals 16a and 16b preferably are plated with gold, for example.

The ground conductor 22 (first ground conductor) is provided on the top surface of the dielectric sheet 18 where the signal line 20 is disposed, as shown in FIGS. 2 and 3, and further, the ground conductor 22 preferably is in the shape of an elongated frame surrounding the signal line 20 when viewed in a plan view in the z-axis direction (i.e., in a normal direction to the dielectric sheet 18). Accordingly, the ground conductor 22, when viewed in a plan view in the z-axis direction (i.e., in the normal direction to the dielectric sheet 18), extends along the signal line 20 in the x-axis direction on both sides of the signal line 20 (i.e., on the positive and negative sides in the y-axis direction). The ground conductor 22 preferably is made of a metal material mainly composed of silver or copper and having a low specific resistance.

The ground conductor 22 includes line portions 22a and 22b, terminal portions 22c and 22d, and protruding portions 23a and 23b, as shown in FIGS. 2 and 3. The line portion 22a is provided on the top surface of the line portion 18a, so as to extend in the x-axis direction on the positive side in the y-axis direction relative to the signal line 20. The line portion 22b is provided on the top surface of the line portion 18a, so as to extend in the x-axis direction on the negative side in the y-axis direction relative to the signal line 20.

The protruding portions 23a and 23b are provided on opposite sides of the signal line 20 (i.e., on the positive and negative sides, respectively, in the y-axis direction), so as to be opposed to each other with respect to the signal line 20. The protruding portions 23a are arranged at equal or substantially equal intervals in the x-axis direction, so as to project from the line portion 22a toward the negative side in the y-axis direction. The protruding portions 23a are not connected to the signal line 20.

The protruding portions 23b are arranged at equal or substantially equal intervals in the x-axis direction, so as to project from the line portion 22b toward the positive side in the y-axis direction. The protruding portions 23b are not connected to the signal line 20.

The terminal portion 22c preferably has a U-shaped or substantially U-shaped configuration extending around the external terminal 16a on the top surface of the connecting portion 18b, as shown in FIG. 2. The terminal portion 22c is connected to the ends of the line portions 22a and 22b on the negative side in the x-axis direction. The terminal portion 22d has a U-shaped or substantially U-shaped configuration extending around the external terminal 16b on the top surface of the connecting portion 18c. The terminal portion 22d is connected to the ends of the line portions 22a and 22b on the positive side in the x-axis direction.

The ground conductor 24 (second ground conductor) is provided on the bottom surface of the dielectric sheet 18, as shown in FIGS. 2 and 3, and further, the ground conductor 24 preferably has an elongated rectangular or elongated substantially rectangular shape overlapping with the signal line 20 when viewed in a plan view in the z-axis direction (i.e., in the normal direction to the dielectric sheet 18). The ground conductor 24 preferably is made of a metal material mainly composed of silver or copper and having a low specific resistance.

The ground conductor 24 includes a line portion 24a and terminal portions 24b and 24c, as shown in FIG. 2. The line portion 24a is provided on the bottom surface of the line portion 18a, and extends in the x-axis direction. The line portion 24a is a solid conductor without any openings. Accordingly, the line portion 24a, when viewed in a plan view in the z-axis direction, overlaps with the signal line 20.

The terminal portion 24b preferably has a rectangular or substantially rectangular shape on the bottom surface of the connecting portion 18b. The terminal portion 24b is connected to the end of the line portion 24a on the negative side in the x-axis direction. The terminal portion 24c preferably has a rectangular or substantially rectangular shape on the bottom surface of the connecting portion 18c. The terminal portion 24c is connected to the end of the line portion 24a on the positive side in the x-axis direction.

The high-permittivity portions 32 preferably have a rectangular or substantially rectangular shape positioned on the positive side in the z-axis direction relative to the signal line 20 and arranged at equal or substantially equal intervals in the x-axis direction, as shown in FIGS. 2 and 3. The high-permittivity portions 32 are disposed in positions corresponding to the protruding portions 23a and 23b, and further, the high-permittivity portions 32 overlap with portions of the signal line 20 and portions of the ground conductor 22 (i.e., the protruding portions 23a and 23b) when viewed in a plan view in the z-axis direction. Accordingly, the high-permittivity portions 32 contact both the portions of the signal line 20 and the portions of the ground conductor 22 (i.e., the protruding portions 23a and 23b). In the present preferred embodiment, the high-permittivity portions 32 contact the ground conductor 22 on both sides of the signal line 20 (i.e., both of the protruding portions 23a and 23b). However, the high-permittivity portions 32 overlap with only a portion, not the entirety, of the dielectric sheet 18. Furthermore, the high-permittivity portions 32 have a higher specific permittivity than the protective layer 14 and the dielectric sheet 18, both of which are adjacent to the signal line 20. Therefore, higher capacitance is generated at the high-permittivity portions 32 than at any other portions between the signal line 20 and the ground conductor 22.

The specific permittivity of the high-permittivity portion 32 preferably is, for example, from 10 to 20. The high-permittivity portion 32 preferably is formed, for example, by printing with a composite dielectric material, which is a mixture of ceramic powder, such as barium titanate or calcium titanate, and a resin paste. The thickness of the high-permittivity portion 32 preferably is, for example, about 10 µm.

As described above, the high-permittivity portions 32 are arranged at equal or substantially equal intervals along the signal line 20. The interval between the high-permittivity portions 32 preferably is shorter than a half of the wavelength of a high-frequency signal to be transmitted through the signal line 20.

Here, areas where the signal line 20 contacts the high-permittivity portions 32 will be referred to as areas A1, as shown in FIG. 4. Areas other than the areas A1 will be referred to as areas A2. The width W1 of the signal line 20 in the area A1 is less than the width W2 of the signal line 20 in the area A2. In this manner, the width of the signal line 20 changes cyclically.

The via-hole conductors b1 pierce through the line portion 18a of the dielectric sheet 18 in the z-axis direction, as shown in FIGS. 2 and 3, and further, the via-hole conductors b1 are arranged in a line in the x-axis direction and positioned on the positive side in the y-axis direction relative to the signal line 20. The via-hole conductors b1, when viewed in a plan view in the z-axis direction, are positioned on the positive side in the y-axis direction relative to the protruding portions 23a. The via-hole conductors b1 connect the ground conductors 22 and 24.

The via-hole conductors b2 pierce through the line portion 18a of the dielectric sheet 18 in the z-axis direction, and further, the via-hole conductors b2 are arranged in a line in the x-axis direction and positioned on the negative side in the y-axis direction relative to the signal line 20. The via-hole conductors b2, when viewed in a plan view in the z-axis direction, are positioned on the negative side in the y-axis direction relative to the protruding portions 23b. The via-hole conductors b2 connect the ground conductors 22 and 24.

The via-hole conductor b3 pierces through the connecting portion 18b of the dielectric sheet 18 in the z-axis direction, and further, the via-hole conductor b3 is positioned on the positive side in the y-axis direction relative to the external terminal 16a. The via-hole conductor b3 connects the ground conductors 22 and 24.

The via-hole conductor b4 pierces through the connecting portion 18b of the dielectric sheet 18 in the z-axis direction, and further, the via-hole conductor b4 is positioned on the negative side in the y-axis direction relative to the external terminal 16a. The via-hole conductor b4 connects the ground conductors 22 and 24.

The via-hole conductor b5 pierces through the connecting portion 18c of the dielectric sheet 18 in the z-axis direction, and further, the via-hole conductor b5 is positioned on the positive side in the y-axis direction relative to the external terminal 16b. The via-hole conductor b5 connects the ground conductors 22 and 24.

The via-hole conductor b6 pierces through the connecting portion 18c of the dielectric sheet 18 in the z-axis direction, and further, the via-hole conductor b6 is positioned on the negative side in the y-axis direction relative to the external terminal 16b. The via-hole conductor b6 connects the ground conductors 22 and 24.

The via-hole conductors b1 to b6 are preferably made of a metal material mainly composed of silver or copper and having a low specific resistance. Note that instead of using the via-hole conductors b1 to b6, through-holes with conductive layers formed, for example, by plating on their inner circumferential surfaces may be used.

The protective layer 14 covers approximately the entire top surface of the dielectric sheet 18. As a result, the signal line 20, the ground conductor 22, and the high-permittivity portions 32 are covered by the protective layer 14. The protective layer 14 is preferably made of, for example, a flexible resin such as a resist material. The specific permittivity of the protective layer 14 preferably is, for example, 4.

Furthermore, the protective layer 14 includes a line portion 14a and connecting portions 14b and 14c, as shown in FIG. 2. The line portion 14a covers the entire top surface of the line portion 18a, thus covering the line portion 22a.

The connecting portion 14b is connected to the end of the line portion 14a on the negative side in the x-axis direction, and covers the top surface of the connecting portion 18b. However, the connecting portion 14b includes openings Ha to Hd provided therein. The opening Ha preferably is a rectangular or substantially rectangular opening provided approximately at the center of the connecting portion 14b. The external terminal 16a is exposed to the outside from the opening Ha. The opening Hb preferably is a rectangular or substantially rectangular opening positioned on the positive side in the y-axis direction relative to the opening Ha. The opening Hc preferably is a rectangular or substantially rectangular opening positioned on the negative side in the x-axis direction relative to the opening Ha. The opening Hd preferably is a rectangular or substantially rectangular opening positioned on the negative side in the y-axis direction relative to the opening Ha. The terminal portion 22c is exposed to the outside from the openings Hb to Hd, so that the exposed portions define and serve as external terminals.

The connecting portion 14c is connected to the end of the line portion 14a on the positive side in the x-axis direction, and covers the top surface of the connecting portion 18c. However, the connecting portion 14c preferably includes openings He to Hh provided therein. The opening He preferably is a rectangular or substantially rectangular opening provided at or approximately at the center of the connecting portion 14c. The external terminal 16b is exposed to the outside from the opening He. The opening Hf preferably is a rectangular or substantially rectangular opening positioned on the positive side in the y-axis direction relative to the opening He. The opening Hg preferably is a rectangular or substantially rectangular opening positioned on the positive side in the x-axis direction relative to the opening He. The opening Hh preferably is a rectangular or substantially rectangular opening positioned on the negative side in the y-axis direction relative to the opening He. The terminal portion 22d is exposed to the outside from the openings Hf to Hh, so that the exposed portions define and serve as external terminals.

The protective layer 15 covers approximately the entire bottom surface of the dielectric sheet 18. As a result, the ground conductor 24 is covered by the protective layer 15. The protective layer 15 is preferably made of, for example, a flexible resin such as a resist material. The specific permittivity of the protective layer 15 preferably is, for example, 4.

Figure 5A:
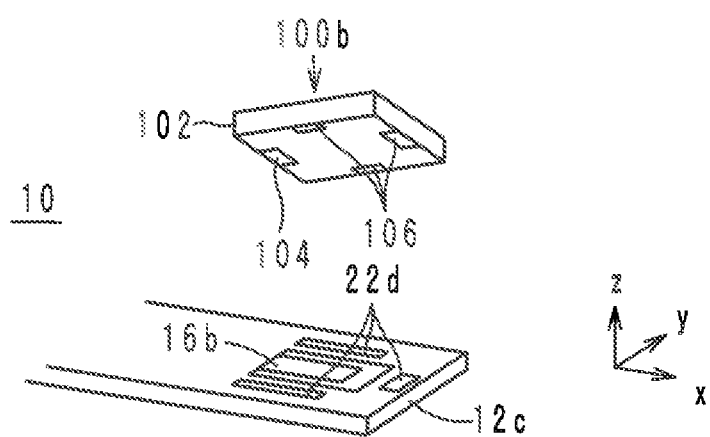
FIG. 5A is an external oblique view of a connector of the high-frequency signal line.
Figure 5B:
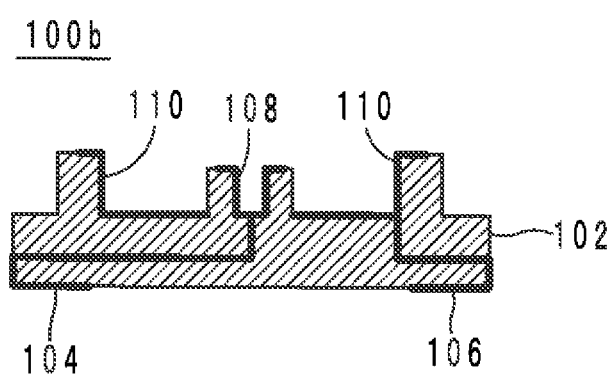
FIG. 5B is a cross-sectional structure view of the connector of the high-frequency signal line.

The connectors 100a and 100b are respectively mounted on the top surfaces of the connecting portions 12b and 12c, so as to be electrically connected to the signal line 20 and the ground conductors 22 and 24. The connecters 100a and 100b preferably have the same configuration, and therefore, only the configuration of the connector 100b will be described below as an example. FIGS. 5A and 5B are an external oblique view and a cross-sectional structure view of the connector 100b of the high-frequency signal line 10.

The connector 100b includes a connector body 102, external terminals 104 and 106, a center conductor 108, and an external conductor 110, as shown in FIGS. 1, 5A, and 5B. The connector body 102 includes a rectangular or substantially rectangular plate and a cylindrical or substantially cylindrical portion coupled thereon, and is made of an insulating material such as resin.

The external terminal 104 is positioned on the surface of the connector body 102 that is located on the negative side in the z-axis direction, so as to face the external terminal 16b. The external terminals 106 are positioned on the surface of the connector body 102 that is located on the negative side in the z-axis direction, so as to correspond to the portions of the terminal portion 22d that are exposed from the openings Hf to Hh.

The center conductor 108 is positioned at the center or approximately center of the cylindrical portion of the connector body 102, and is connected to the external terminal 104. The center conductor 108 is a signal terminal to/from which a high-frequency signal is inputted/outputted. The external conductor 110 is positioned on the inner circumferential surface of the cylindrical portion of the connector body 102, and is connected to the external terminals 106. The external conductor 110 is a ground terminal to be kept at a ground potential.

The connector 100b thus configured is mounted on the top surface of the connecting portion 12c, such that the external terminal 104 is connected to the external terminal 16b, and the external terminals 106 are connected to the terminal portion 22d. As a result, the signal line 20 is electrically connected to the center conductor 108. In addition, the ground conductors 22 and 24 are electrically connected to the external conductor 110.

In the high-frequency signal line 10 thus configured, the characteristic impedance Z1 of the signal line 20 in the area A1 differs from the characteristic impedance Z2 of the signal line 20 in the area A2. More specifically, in the area A1, the high-permittivity portion 32 contacts the signal line 20 and the ground conductor 22. On the other hand, in the area A2, the protective layer 14 contacts the signal line 20 and the ground conductor 22. The specific permittivity of the high-permittivity portion 32 is higher than the specific permittivity of the protective layer 14. Accordingly, the capacitance generated between the signal line 20 and the ground conductor 22 is higher in the area A1 than in the area A2. Accordingly, the characteristic impedance Z1 of the signal line 20 in the area A1 is lower than the characteristic impedance Z2 of the signal line 20 in the area A2. The characteristic impedance Z1 preferably is, for example, about 30Ω, and the characteristic impedance Z2 preferably is, for example, about 70Ω. The characteristic impedance of the entire signal line 20 preferably is, for example, about 50Ω.

Furthermore, in the high-frequency signal line 10, the characteristic impedance Z3 of the signal line 20 at each end (i.e., at each of the external terminals 16a and 16b) has a value between the characteristic impedance Z1 and the characteristic impedance Z2.

A non-limiting example of the method for producing the high-frequency signal line 10 will be described below with reference to FIG. 2. While the following description focuses on one high-frequency signal line 10 as an example, in actuality, large-sized dielectric sheets are laminated and cut, so that a plurality of high-frequency signal lines 10 are produced at the same time.

Prepared first is a dielectric sheet 18 made of a thermoplastic resin and having its entire top and bottom surfaces copper-foiled. The copper-foiled surfaces of the dielectric sheet 18 is smoothened, for example, by galvanization for rust prevention. The thickness of the copper foil preferably is from about 10 μm to about 20 μm, for example.

Next, a signal line 20 and aground conductor 22, as shown in FIG. 2, are formed on the top surface of the dielectric sheet 18 preferably by photolithography, and a ground conductor 24, as shown in FIG. 2, is formed on the bottom surface of the dielectric sheet 18. Specifically, resists are preferably printed on the copper-foiled top surface of the dielectric sheet 18 in the same patterns as the signal line 20 and the ground conductor 22 shown in FIG. 2, and a resist preferably is printed on the copper-foiled bottom surface of the dielectric sheet 18 in the same pattern as the ground conductor 24 shown in FIG. 2. Then, any portions of the copper foil that are not coated with the resists are removed by etching. Thereafter, the resists are removed. As a result, the signal line 20 and the ground conductor 22 are formed on the top surface of the dielectric sheet 18, and the ground conductor 24 is formed on the bottom surface of the dielectric sheet 18, as shown in FIG. 2.

Next, via-holes are bored through the dielectric sheet 18 by irradiating the bottom surface with laser beams where via-hole conductors b1 to b6 are to be formed. Thereafter, the via-holes provided in the dielectric sheet 18 are filled with a conductive paste.

Next, screen printing with a paste of a composite dielectric material is performed on the top surface of the dielectric sheet 18, thus forming high-permittivity portions 32 on the signal line 20. Thereafter, the high-permittivity portions 32 are dried.

Lastly, a resin (resist) paste is applied to the top and bottom surfaces of the dielectric sheet 18, thus forming protective layers 14 and 15 thereon.

The high-frequency signal line 10 thus configured renders it possible to significantly reduce or prevent the occurrence of low-frequency noise. More specifically, in the high-frequency signal line 10, the high-permittivity portions 32 contact the signal line 20 and the ground conductor 22 in the areas A1. On the other hand, the protective layer 14 contacts the signal line 20 and the ground conductor 22 in the areas A2. The specific permittivity of the high-permittivity portion 32 is higher than the specific permittivity of the protective layer 14. Accordingly, the capacitance generated between the signal line 20 and the ground conductor 22 is higher in the area A1 than in the area A2. Therefore, the characteristic impedance Z1 of the signal line 20 in the area A1 is lower than the characteristic impedance Z2 of the signal line 20 in the area A2. Accordingly, the signal line 20 switches cyclically between the characteristic impedance Z1 and the characteristic impedance Z2. As a result, in the signal line 20, a standing wave with a short wavelength (i.e., a high frequency) occurs between the high-permittivity portions 32. On the other hand, there is little chance of a standing wave with a long wavelength (i.e., a low frequency) occurring between the external terminals 16a and 16b. Thus, the high-frequency signal line 10 renders it possible to significantly reduce or prevent the occurrence of low-frequency noise.

Note that in the high-frequency signal line 10, high-frequency noise occurs because of a standing wave generated between the high-permittivity portions 32. Therefore, the distance between the high-permittivity portions 32 is designed to be sufficiently short to cause such noise to be out of the frequency band of high-frequency signals to be transmitted through the signal line 20. To this end, the high-permittivity portions 32 is provided along the signal line 20 at intervals of less than a half of the wavelength of such a high-frequency signal to be transmitted through the signal line 20.

Further, in the high-frequency signal line 10, the characteristic impedance Z3 at each end of the signal line 20 has a value between the characteristic impedance Z1 of the signal line 20 in the area A1 and the characteristic impedance Z2 of the signal line 20 in the area A2. Accordingly, the signal line 20 allows a standing wave with a short wavelength to readily occur between the high-permittivity portions 32, and there is little chance of a standing wave with a long wavelength occurring between both ends of the signal line 20. Thus, the high-frequency signal line 10 renders it possible to significantly reduce or prevent the occurrence of low-frequency noise more effectively.

Still further, the main body 12 of the high-frequency signal line 10 is very thin. More specifically, the high-frequency signal line 500 described in Japanese Utility Model No. 3173143 requires the three dielectric sheets 504a to 504c. On the other hand, the high-frequency signal line 10 has the high-permittivity portions 32 provided on both the signal line 20 and the ground conductor 22 in order to increase the capacitance generated between the signal line 20 and the ground conductor 22 in the areas A1. Accordingly, the high-frequency signal line 10 does not require another dielectric sheet 18 to be provided on the signal line 20 and the ground conductor 22. Therefore, the high-frequency signal line 10 requires only one dielectric sheet 18. Moreover, the high-permittivity portions 32 do not cover the dielectric sheet 18 entirely. Thus, the main body 12 is capable of being very thin. The thinner the high-frequency signal line 10 becomes, the more readily the high-frequency signal line 10 is bent.

Yet further, in the high-frequency signal line 10, the signal line 20, the ground conductors 22 and 24, etc., are connected in a highly reliable manner. More specifically, in the high-frequency signal line 500 described in Japanese Utility Model No. 3173143, the dielectric sheets 504a to 504c are laminated, and therefore, in order to connect the external electrodes with the signal line 506 and also connect the ground conductor 508 with the ground conductor 510, it is necessary to form via-hole conductors that pierce through the dielectric sheets 504a and 504b. On the other hand, the high-frequency signal line 10 requires only one dielectric sheet 18, and therefore, it is not necessary to form via-hole conductors that pass through a plurality of dielectric sheets. Thus, the connections between the ground conductors are prevented from being impaired because of the occurrence of breakage in the via-hole conductors.

Yet further, in the high-frequency signal line 10, the width W1 of the signal line 20 in the area A1 is less than the width W2 of the signal line 20 in the area A2. Thus, the capacitance generated between the signal line 20 and the ground conductor 22 in the area A1 is prevented from becoming excessively high.

Yet further, in the high-frequency signal line 10, the gaps between the signal line 20 and the line portions 22a and 22b are reduced so that electrical lines of force from the signal line 20 are readily absorbed into the ground conductor 22. Thus, noise radiation from the signal line 20 is significantly reduced or prevented.

Yet further, the high-frequency signal line 10 renders it possible to prevent magnetic flux leakage therefrom. More specifically, when a current i1 (see FIG. 4) flows through the signal line 20, magnetic flux rotating around the signal line 20 is generated. If such magnetic flux leaks out of the high-frequency signal line 10, the signal line 20 might be coupled to a signal line of another circuit by a magnetic field. As a result, it becomes difficult to obtain desired characteristics of the high-frequency signal line 10.

Therefore, in the high-frequency signal line 10, the signal line 20 is surrounded by the ground conductor 22. Accordingly, the signal line 20 and the ground conductor 22 are positioned close to each other. When the current i1 flows through the signal line 20, a feedback current i2 flows through the ground conductor 22 in the opposite direction to the current i1. Accordingly, the rotating direction of the magnetic flux around the signal line 20 is opposite to the rotating direction of the magnetic flux around the ground conductor 22. In this case, these magnetic fluxes intensify each other in the gaps between the signal line 20 and the ground conductor 22, but they cancel out each other in areas located on the positive or negative side in the y-axis direction relative to the ground conductor 22 (i.e., the areas being located outside the high-frequency signal line 10). Thus, magnetic flux leakage from the high-frequency signal line 10 is reliably prevented.

First Modification

Hereinafter, a high-frequency signal line 10a according to a first modification of a preferred embodiment of the present invention will be described with reference to the drawings. FIG. 6 is an oblique exploded view of a laminate 12 of the high-frequency signal line 10a according to the first modification. For the external oblique view of the high-frequency signal line 10a, FIG. 1 will be referenced.

The high-frequency signal line 10a differs from the high-frequency signal line 10 in that the ground conductor 24 is not provided. Further, since the ground conductor 24 is not provided, the via-hole conductors b1 to b6 and the protective layer 15 are unnecessary. Other components are the same as those of the high-frequency signal line 10, and therefore, any descriptions thereof will be omitted.

The high-frequency signal line 10a achieves the same effects as those achieved by the high-frequency signal line 10. Moreover, since the high-frequency signal line 10a is not provided with the ground conductor 24 and the protective layer 15, the main body 12 is much thinner, and the high-frequency signal line 10a is bent readily.

Second Modification

Figure 7:
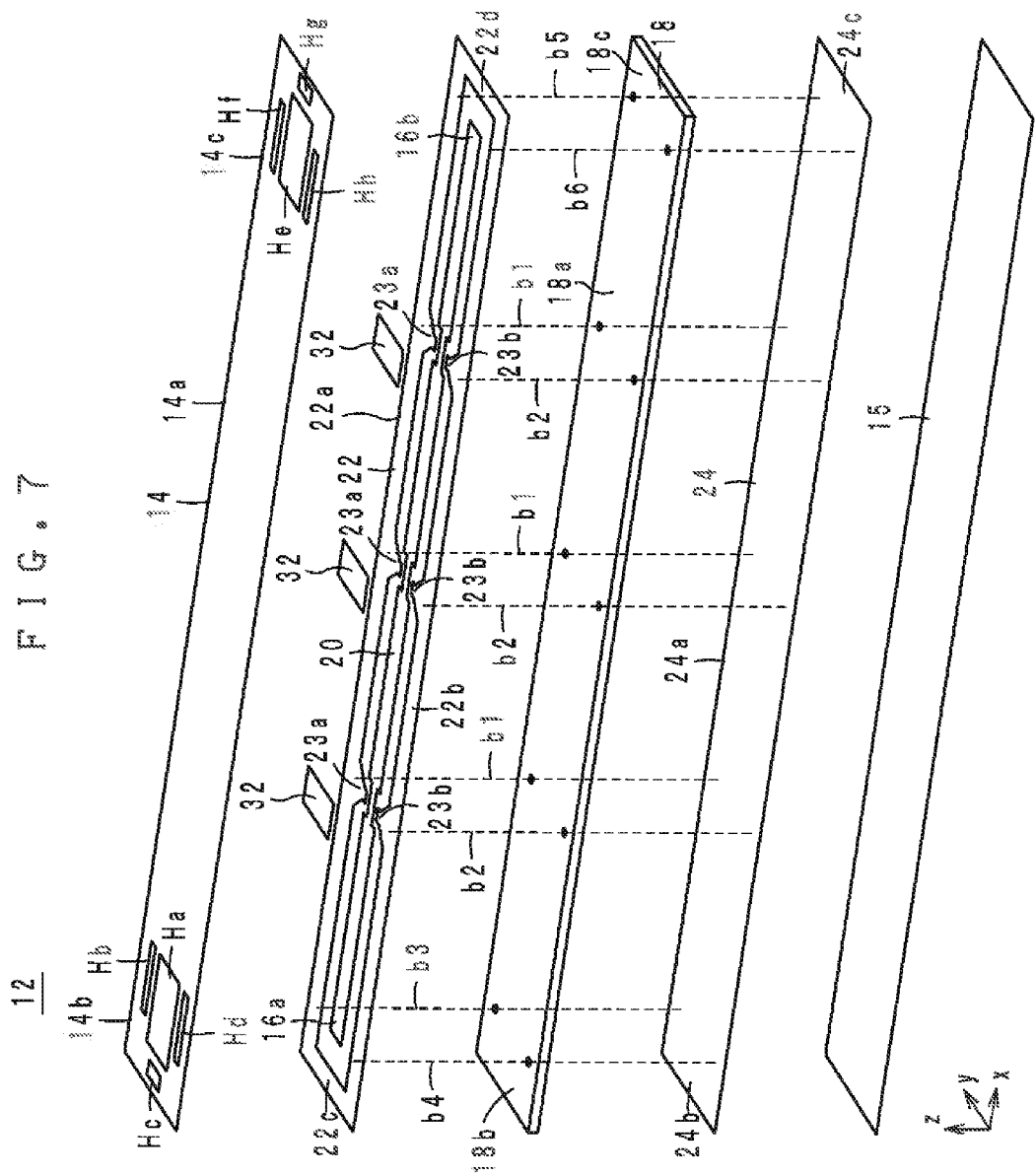
FIG. 7 is an oblique exploded view of a laminate of a high-frequency signal line according to a second modification of a preferred embodiment of the present invention.

Hereinafter, a high-frequency signal line 10b according to a second modification of a preferred embodiment of the present invention will be described with reference to the drawings. FIG. 7 is an oblique exploded view of a laminate 12 of the high-frequency signal line 10b according to the second modification. For the external oblique view of the high-frequency signal line 10b, FIG. 1 will be referenced.

The high-frequency signal line 10b differs from the high-frequency signal line 10 in that the width of the protruding portions 23a and 23b in the x-axis direction becomes thicker toward the line portions 22a and 22b. Accordingly, the gaps between the signal line 20 and the line portions 22a and 22b become gradually wider or narrower near the boundaries between the areas A1 and A2. Accordingly, the magnetic flux that is generated around the signal line 20 so as to pass through the gaps between the signal line 20 and the line portions 22a and 22b increases or decreases gradually near the boundaries between the areas A1 and A2. That is, significant fluctuations in magnetic field energy are significantly reduced or prevented near the boundaries between the areas A1 and A2. Thus, the occurrence of high-frequency signal radiation are significantly reduced or prevented near the boundaries between the areas A1 and A2.

Note that the width of the protruding portions 23a and 23b in the x-axis direction increases continuously toward the line portions 22a and 22b, but such an increase may be gradual.

Third Modification

Figure 8:
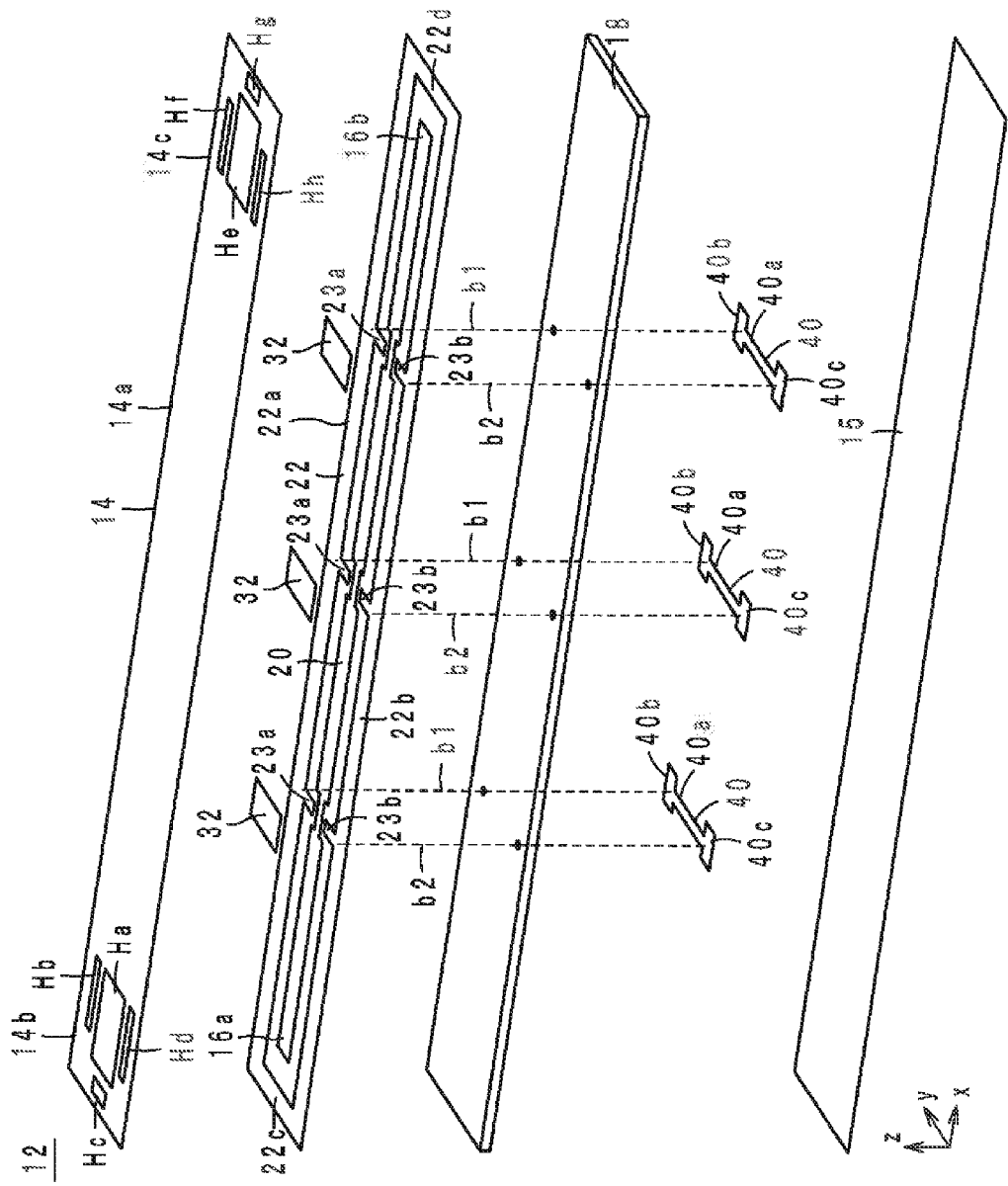
FIG. 8 is an oblique exploded view of a laminate of a high-frequency signal line according to a third modification of a preferred embodiment of the present invention.

Hereinafter, a high-frequency signal line 10c according to a third modification of a preferred embodiment of the present invention will be described with reference to the drawings. FIG. 8 is an oblique exploded view of a laminate 12 of the high-frequency signal line 10c according to the third modification. For the external oblique view of the high-frequency signal line 10c, FIG. 1 will be referenced.

The high-frequency signal line 10c differs from the high-frequency signal line 10a in that bridge conductors 40 are further provided. More specifically, the bridge conductors 40 are provided on the bottom surface of the dielectric sheet 18 so as to overlap with the ground conductor 22 and the signal line 20 when they are viewed in a plan view in the z-axis direction. The bridge conductors 40 are connected to the ground conductor 22 at opposite ends in the y-axis direction. The bridge conductors are preferably formed, for example, by printing with a conductive paste of Ag or the like.

More specifically, the bridge conductors 40 preferably have an H-shaped or substantially H-shaped configuration, and each of them includes a capacitor portion 40a and connecting portions 40b and 40c, as shown in FIG. 8. The capacitor portion 40a is a linear conductor extending in the y-axis direction, and further, the capacitor portion 40a crosses and overlaps with the signal line 20 when viewed in a plan view in the z-axis direction. The dielectric sheet 18 is positioned between the capacitor portion 40a and the signal line 20, and therefore, capacitance is generated therebetween.

The connecting portion 40b is connected to the end of the capacitor portion 40a on the positive side in the y-axis direction, and extends in the x-axis direction. Moreover, the connecting portion 40b, when viewed in a plan view in the z-axis direction, overlaps with the line portion 22a and the protruding portion 23a. The via-hole conductor b1 connects the connecting portion 40b and the ground conductor 22.

The connecting portion 40c is connected to the end of the capacitor portion 40a on the negative side in the y-axis direction, and extends in the x-axis direction. Moreover, the connecting portion 40c, when viewed in a plan view in the z-axis direction, overlaps with the line portion 22b and the protruding portion 23b. The via-hole conductor b2 connects the connecting portion 40c and the ground conductor 22.

The high-frequency signal line 10c achieves the same effects as those achieved by the high-frequency signal line 10. Moreover, in the high-frequency signal line 10c, the bridge conductors 40 connected to the ground conductor 22 are positioned on the opposite side from the signal line 20. As a result, the capacitance generated between the signal line 20 and the ground conductor 22 is increased. Thus, the characteristic impedance Z1 of the signal line 20 in the area A1 is significantly reduced.

Fourth Modification

Figure 9:
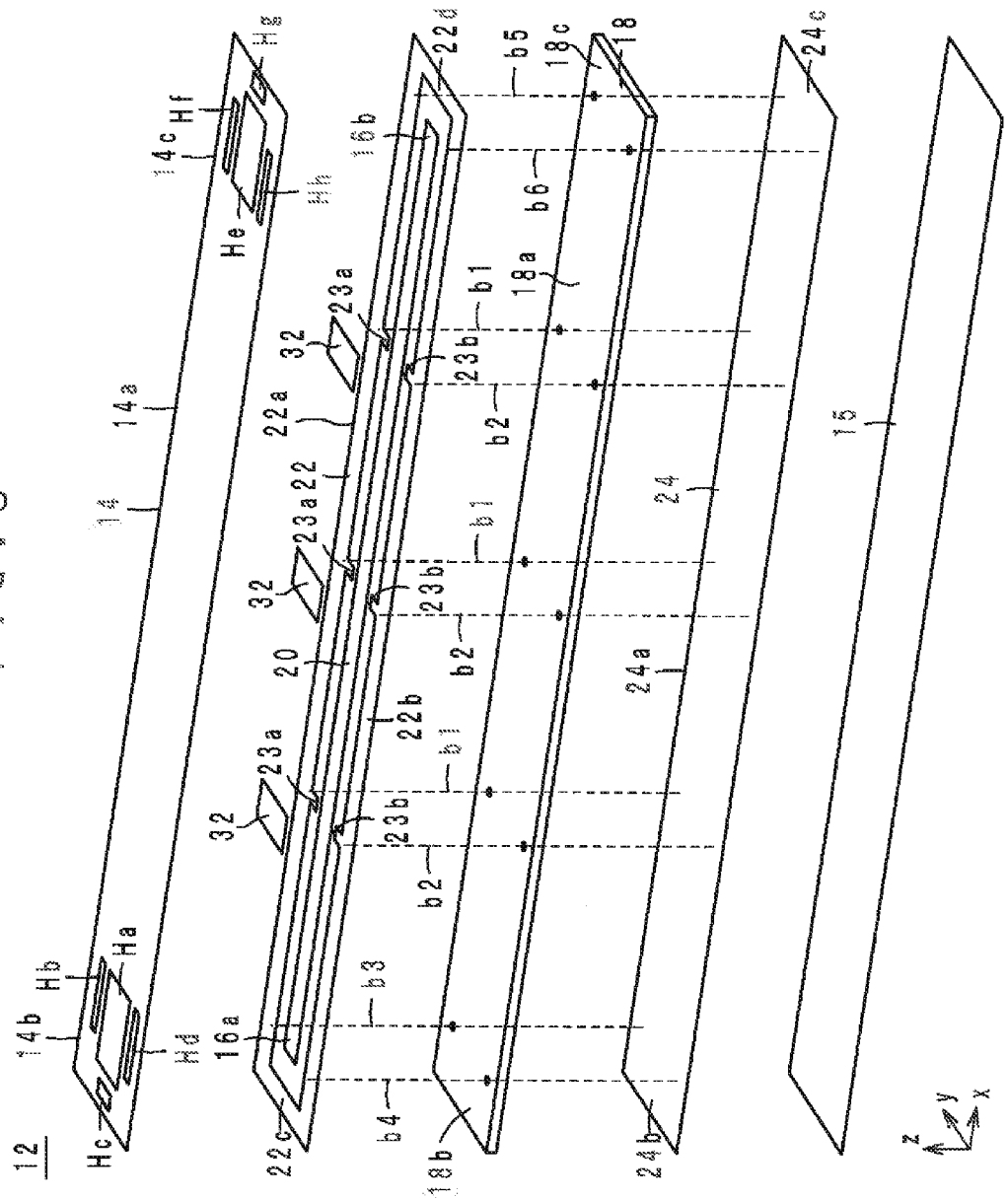
FIG. 9 is an oblique exploded view of a laminate of a high-frequency signal line according to a fourth modification of a preferred embodiment of the present invention.

Hereinafter, a high-frequency signal line 10d according to a fourth modification of a preferred embodiment of the present invention will be described with reference to the drawings. FIG. 9 is an oblique exploded view of a laminate 12 of the high-frequency signal line 10d according to the fourth modification. For the external oblique view of the high-frequency signal line 10d, FIG. 1 will be referenced.

The high-frequency signal line 10d differs from the high-frequency signal line 10 in that the width of the signal line 20 is uniform. The high-frequency signal line 10d thus configured also achieves the same effects as those achieved by the high-frequency signal line 10.

Fifth Modification

Figure 10:
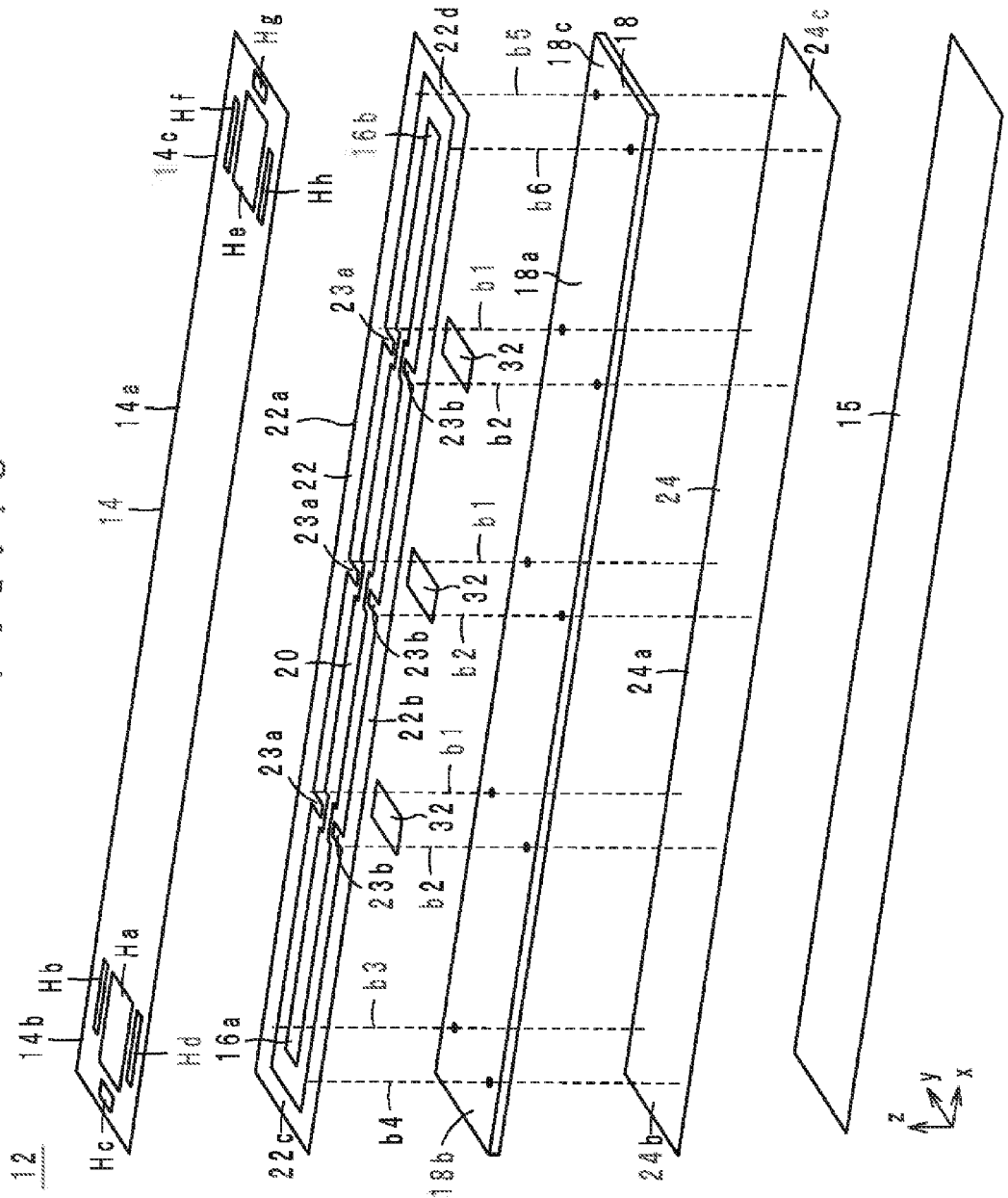
FIG. 10 is an oblique exploded view of a laminate of a high-frequency signal line according to a fifth modification of a preferred embodiment of the present invention.
Figure 11:
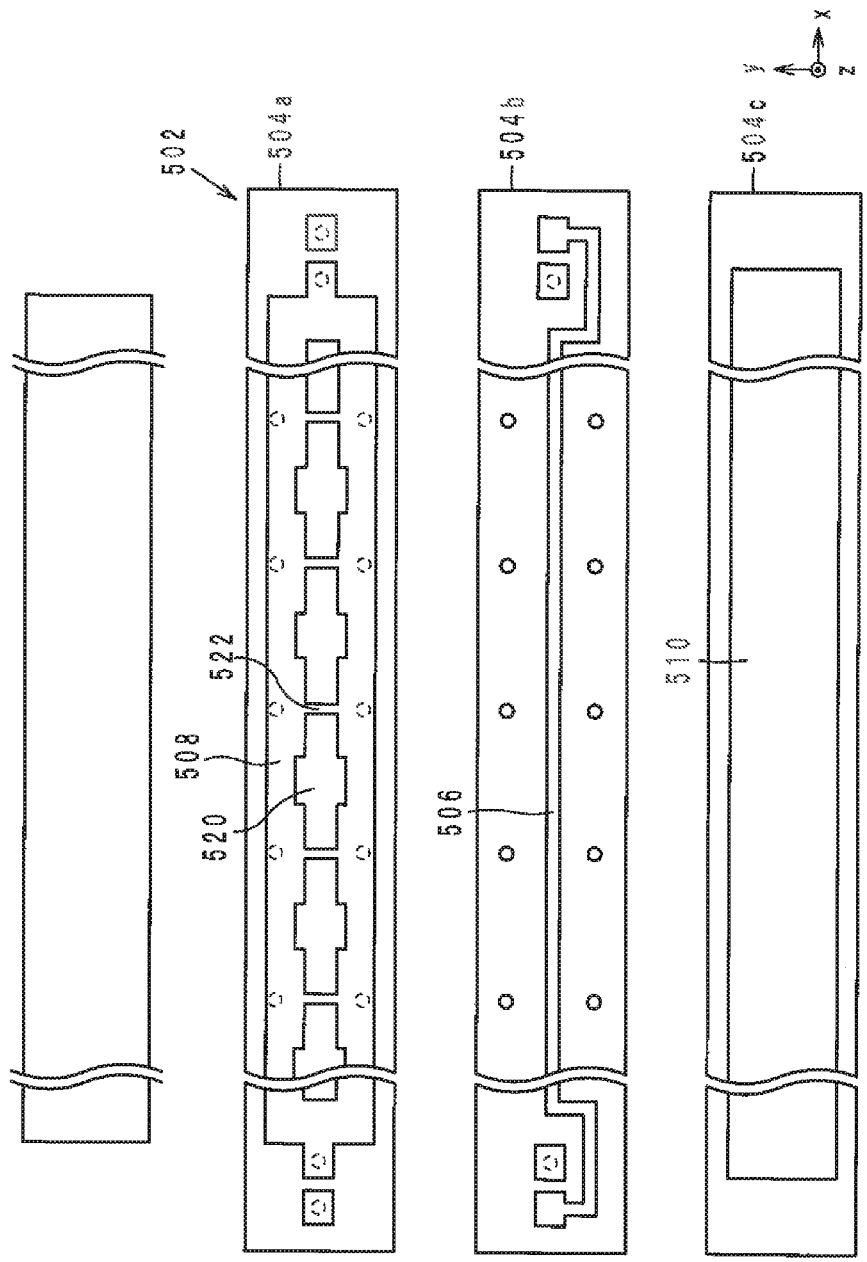
FIG. 11 is an exploded view of a high-frequency signal line described in Japanese Utility Model No. 3173143.

Hereinafter, a high-frequency signal line 10e according to a fifth modification of a preferred embodiment of the present invention will be described with reference to the drawings. FIG. 10 is an oblique exploded view of a laminate 12 of the high-frequency signal line 10e according to the fifth modification. For the external oblique view of the high-frequency signal line 10e, FIG. 1 will be referenced.

The high-frequency signal line 10e differs from the high-frequency signal line 10 in that the high-permittivity portions 32 are positioned between the signal line 20 or the ground conductor 22 and the dielectric sheet 18. The high-frequency signal line 10e thus configured also achieves the same effects as those achieved by the high-frequency signal line 10.

Note that in producing the high-frequency signal line 10e, the signal line 20 and the ground conductor 22 are transferred onto the top surface of the dielectric sheet 18 after the high-permittivity portions 32 are printed on the top surface of the dielectric sheet 18.

Other Preferred Embodiments

The present invention is not limited to the high-frequency signal lines 10 and 10a to 10e according to the above-described preferred embodiments, and can be applied to any high-frequency signal lines within the spirit and scope of the present invention.

Furthermore, the configurations or features of the high-frequency signal lines 10 and 10a to 10e may be used in combination.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A high-frequency signal line, comprising:
   a base layer including first and second principal surfaces;
   a signal line provided on the first principal surface;
   a ground conductor provided on the first principal surface along the signal line; and
   a plurality of high-permittivity portions arranged along the signal line and in contact with a portion of both the signal line and the ground conductor, each of the high-permittivity portions having a higher specific permittivity than the base layer; wherein
   the ground conductor includes:
      a line portion extending along the signal line; and
      protruding portions protruding from the line portion towards the signal line; and
   the plurality of high-permittivity portions overlap with the protruding portions when viewed in a plan view in a direction perpendicular to the first principal surface.

2. The high-frequency signal line according to claim 1, further comprising a main body defining the base layer and via-hole conductors provided in the main body.

3. The high-frequency signal line according to claim 2, wherein the main body is a flexible laminate body including a first protective layer, a dielectric sheet, and a second protective layer laminated in this order.

4. The high-frequency signal line according to claim 3, wherein the ground conductor is provided on a top surface of the dielectric sheet where the signal line is disposed, and the ground conductor has an elongated frame shape surrounding the signal line.

5. The high-frequency signal line according to claim 3, wherein the plurality of high-permittivity portions overlap contact the ground conductor on both sides of the signal line, and the plurality of high-permittivity portions overlap with only a portion, not an entirety, of the dielectric sheet.

6. The high-frequency signal line according to claim 3, wherein the signal line, the ground conductor, and the plurality of high-permittivity portions are covered by one of the first protective layer and the second protective layer.

7. The high-frequency signal line according to claim 3, further comprising bridge conductors provided on a bottom surface of the dielectric sheet so as to overlap with the ground conductor and the signal line.

8. The high-frequency signal line according to claim 3, wherein the plurality of high-permittivity portions are positioned between the signal line or the ground conductor and the dielectric sheet.

9. The high-frequency signal line according to claim 1, wherein
   the ground conductor is positioned on both sides of the signal line; and
   the plurality of high-permittivity portions contact the ground conductor on both sides of the signal line.

10. The high-frequency signal line according to claim 1, further comprising a second ground conductor arranged on the second principal surface so as to overlap with the signal line when viewed in a plan view in the direction perpendicular to the first principal surface.

11. The high-frequency signal line according to claim 1, wherein the signal line has a lower characteristic impedance in first areas where the signal line contacts the plurality of high-permittivity portions than in second areas other than the first areas.

12. The high-frequency signal line according to claim 1, wherein the plurality of high-permittivity portions each have a rectangular or substantially rectangular shape and are arranged at equal or substantially equal intervals along the signal line, and the plurality of high-permittivity portions overlap with portions of the signal line and portions of the ground conductor such that the plurality of high-permittivity portions contact both the portions of the signal line and the portions of the ground conductor.

13. A high-frequency signal line, comprising:
   a base layer including first and second principal surfaces;
   a signal line provided on the first principal surface;
   a ground conductor provided on the first principal surface along the signal line; and
   a plurality of high-permittivity portions arranged along the signal line and in contact with a portion of both the signal line and the ground conductor, each of the high-permittivity portions having a higher specific permittivity than the base layer; wherein
   the plurality of high-permittivity portions are arranged along the signal line at intervals of less than one half or about one half of the wavelength of a high-frequency signal to be transmitted through the signal line.

14. The high-frequency signal line according to claim 13, wherein
   the ground conductor is positioned on both sides of the signal line; and
   the plurality of high-permittivity portions contact the ground conductor on both sides of the signal line.

15. The high-frequency signal line according to claim 13, further comprising a second ground conductor arranged on the second principal surface so as to overlap with the signal line when viewed in a plan view in a direction perpendicular or substantially perpendicular to the base layer.

16. The high-frequency signal line according to claim 13, wherein the signal line has a lower characteristic impedance in first areas where the signal line contacts the plurality of high-permittivity portions than in second areas other than the first areas.

17. A high-frequency signal line, comprising:
   a base layer including first and second principal surfaces;
   a signal line provided on the first principal surface;
   a ground conductor provided on the first principal surface along the signal line; and
   a plurality of high-permittivity portions arranged along the signal line and in contact with a portion of both the signal line and the ground conductor, each of the high-permittivity portions having a higher specific permittivity than the base layer; wherein
   the signal line is narrower in first areas where the signal line contacts the plurality of high-permittivity portions than in second areas other than the first areas.

18. The high-frequency signal line according to claim 17, wherein
   the ground conductor is positioned on both sides of the signal line; and
   the plurality of high-permittivity portions contact the ground conductor on both sides of the signal line.

19. The high-frequency signal line according to claim 17, further comprising a second ground conductor arranged on the second principal surface so as to overlap with the signal line when viewed in a plan view in a direction perpendicular or substantially perpendicular to the base layer.

20. The high-frequency signal line according to claim 17, wherein the signal line has a lower characteristic impedance in first areas where the signal line contacts the plurality of high-permittivity portions than in second areas other than the first areas.

* * * * *